(12) United States Patent
Horgan

(10) Patent No.: US 8,417,810 B2
(45) Date of Patent: Apr. 9, 2013

(54) SYSTEM AND METHOD FOR MANAGING COUNTERS

(75) Inventor: Nicholas Horgan, Waltham, MA (US)

(73) Assignee: Broadcom Corporation, Irvine, CA (US)

( * ) Notice: Subject to any disclaimer, the term of this patent is extended or adjusted under 35 U.S.C. 154(b) by 792 days.

(21) Appl. No.: 11/971,787

(22) Filed: Jan. 9, 2008

(65) Prior Publication Data

US 2008/0165914 A1    Jul. 10, 2008

Related U.S. Application Data

(60) Provisional application No. 60/879,542, filed on Jan. 10, 2007.

(51) Int. Cl.
*G06F 15/173* (2006.01)
*G06F 15/16* (2006.01)
*H03K 23/44* (2006.01)

(52) U.S. Cl.
USPC ............................ 709/224; 709/200; 377/107

(58) Field of Classification Search ............ None
See application file for complete search history.

(56) References Cited

U.S. PATENT DOCUMENTS

| 3,905,020 | A | * | 9/1975 | Knox | 340/825.22 |
|---|---|---|---|---|---|
| 4,219,877 | A | * | 8/1980 | Vladimirov et al. | 708/200 |
| 5,014,231 | A | * | 5/1991 | Reinhardt et al. | 708/271 |
| 5,113,507 | A | * | 5/1992 | Jaeckel | 711/5 |
| 5,255,238 | A | * | 10/1993 | Ichige et al. | 365/220 |
| 5,450,452 | A | * | 9/1995 | Kakuishi et al. | 375/376 |
| 5,493,673 | A | * | 2/1996 | Rindos et al. | 713/502 |
| 6,233,297 | B1 | * | 5/2001 | Itoh | 375/376 |
| 6,385,637 | B1 | * | 5/2002 | Peters et al. | 718/107 |
| 7,106,227 | B2 | * | 9/2006 | Karlquist | 341/101 |
| 7,310,310 | B1 | * | 12/2007 | Shenoi et al. | 370/235 |
| 2007/0098020 | A1 | * | 5/2007 | Ja et al. | 370/503 |

* cited by examiner

*Primary Examiner* — Thu Nguyen
*Assistant Examiner* — Angela Widhalm
(74) *Attorney, Agent, or Firm* — Sterne, Kessler, Goldstein & Fox P.L.L.C.

(57) ABSTRACT

A counter system and method and computer program product for managing counter systems. Counter systems management includes receiving a count event associated with a counter, updating a first stage counter value based on the count event, determining whether to eject the counter value based on a random function of the counter state, and ejecting the counter value. A counter system comprises a first stage update unit configured to accept a count event and to eject a counter. A second stage update unit may be configured to accept an ejected counter value, and includes a second counting module configured to accumulate the ejected counter value.

60 Claims, 9 Drawing Sheets

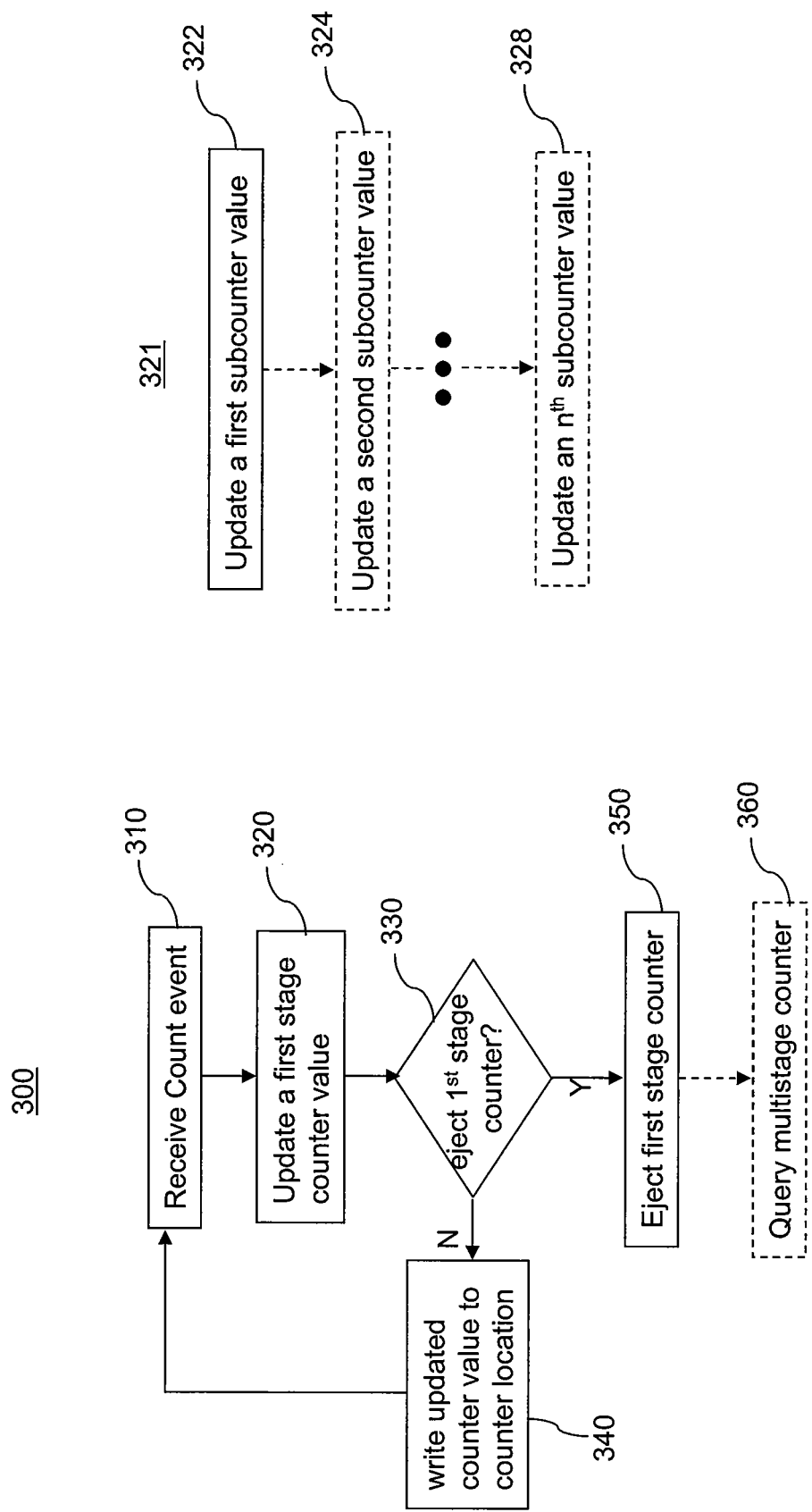

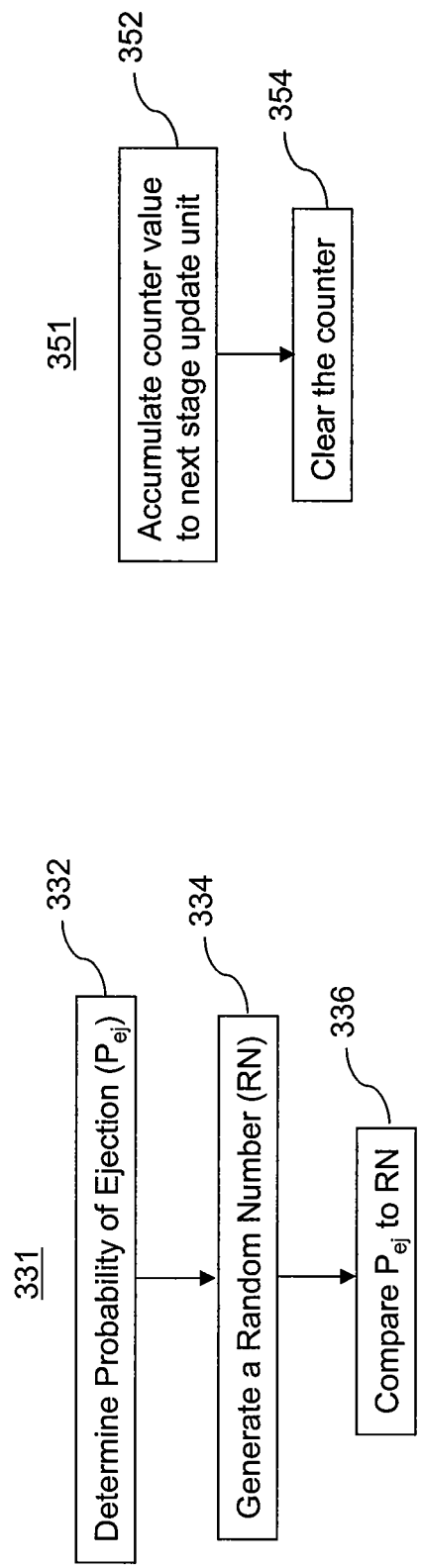

SYSTEM AND METHOD FOR MANAGING COUNTERS

CROSS REFERENCE TO RELATED APPLICATIONS

This application claims the benefit of U.S. Provisional Application No. 60/879,542 filed Jan. 10, 2007, which is incorporated herein by reference in its entirety.

BACKGROUND OF THE INVENTION

1. Field of the Invention

The invention is related to computer systems and networked computer systems.

2. Background Art

Maintaining multiple counters is a prerequisite in computer systems. For example, networked computer systems may have hundreds of thousands of counters configured to count sent and received packets and bytes. Each counted event requires a reading of the counter's current state, modifying the counter's state, and writing the new state back to the counter. In a large networked system transferring data at high rates, there may be millions of counter reads and writes per second.

Some systems require counters with a range sufficient to rarely overflow. Even at 24 Gb/sec rates, a 64 bit counter will not overflow for nearly 200 years. However, reading and writing millions of 64 bit counter values per second uses a significant amount of bandwidth and space in typically expensive high speed memory. Thus, some systems use shorter high rate counters and aggregate the high rate counters to larger low rate counters. These systems typically poll the high rate counters often enough to prevent counter overflows. Because shorter high rate counters overflow sooner than longer high rate counters, system design involves a trade-off between the size of the high rate counter and the poll rate. When the number of counters grows very large, even a low poll rate results in significant bandwidth requirements, thus requiring larger high rate counters.

What is needed is a bandwidth efficient counter management technique and system.

BRIEF SUMMARY OF THE INVENTION

Instead of using a polling scheme to prevent overflow, embodiments of the invention incorporate a randomized ejection capability in high rate counters. As a high rate counter is updated a random decision to eject the counter is effected as a function of the counter's current state. Ejection involves zeroing a compact high rate counter and accumulating its value to a larger lower rate counter. The probability of ejection approaches unity as the high rate counter value approaches its maximum range. A low rate counter accumulates the ejected value. Thus the high rate counter avoids overflow without polling, thus reducing bandwidth requirements.

In an embodiment, an example method and an example computer program product for managing a counter system. These include receiving a count event associated with a counter, updating a first stage counter value based on the count event, determining whether to eject the counter value based on a random function of its expiration, and ejecting the counter value.

In an embodiment, a counter system has a first stage update unit. The first stage update unit is configured to accept a count event and to eject a counter. A second stage update unit may be configured to accept an ejected counter value, and includes a second counting module configured to accumulate the ejected counter value.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

FIG. 3A shows flowchart 300, illustrating an exemplary method for managing a counter system according to embodiments of the invention.

FIG. 3B shows flowchart 321, illustrating an exemplary method for updating a counter value according to embodiments of the invention.

FIG. 3C shows flowchart 331, illustrating an exemplary method for determining whether to eject a counter according to embodiments of the invention.

FIG. 3D shows flowchart 351, illustrating an exemplary method for ejecting a counter according to embodiments of the invention.

Figure 1A:
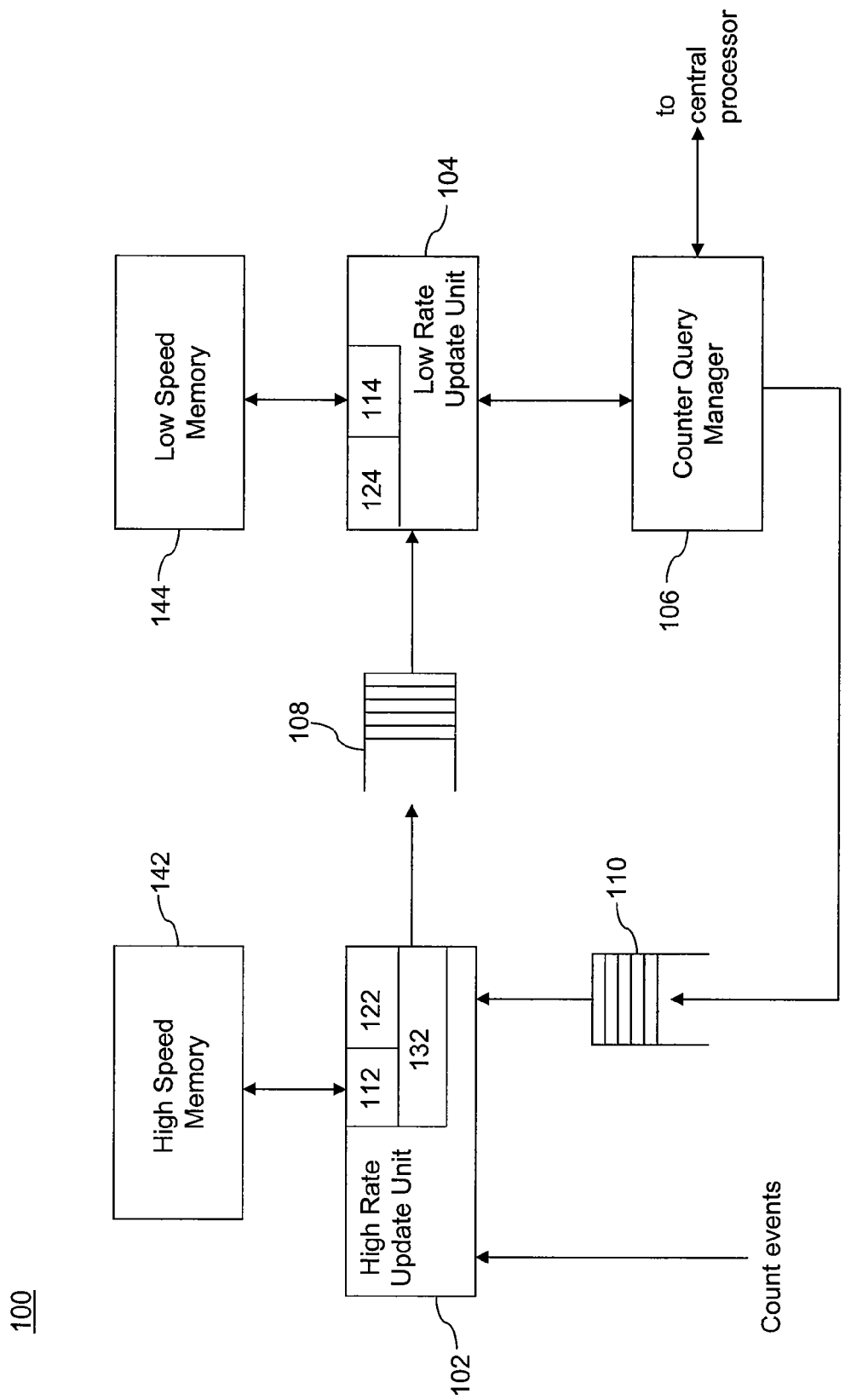
FIGS. 1A-1C show various exemplary counter management systems according to embodiments of the invention.

The present invention will now be described with reference to the accompanying drawings. In the drawings, like reference numbers may indicate identical or similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be used in a variety of other applications. The scope of the invention is not limited to the disclosed embodiments. The invention is defined by the claims appended hereto.

References to "one embodiment," "an embodiment," "this embodiment," "an example embodiment," etc., indicate that the embodiment described may include a particular feature, structure, or characteristic, but every embodiment might not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to effect such a feature, structure, or characteristic in connection with other embodiments whether or not explicitly described.

Example Counter Management System

FIG. 1A illustrates an exemplary counter management system 100 according to one embodiment of the present invention. Counter management system 100 may be implemented in hardware, software, or both. A first stage update unit 102 comprises an optional first stage counter value interface module 112, a first stage counting module 122, and an ejection module 132. In an embodiment, first stage update unit 102 is termed a "high rate update unit."

First stage counter value interface module 112 provides an interface to the optional first stage storage device 142. First stage storage device 142 may be any storage medium, including on-board cache, random access memory (RAM), hard drive, etc. In an embodiment, first stage storage device 142 is high speed memory (e.g., static random access memory (SRAM)).

First stage counting module 122 is configured to update a first stage counter value based on a count event received by first stage update unit 102. In an embodiment, the first stage counting module 122 increments the first stage counter value. In another embodiment, it accumulates a number based on the count event to the first stage counter value. For example, in an embodiment, first stage counting module 122 counts bytes received. If a count event corresponding to the receipt of a packet containing twelve bytes is received, the first stage counting module 122 would add twelve to the first stage counter value. In yet another embodiment, the first stage counter includes multiple subcounters, thus the first stage counter value includes multiple subvalues. For example, an embodiment of first stage counting module 122 counts bytes and packets received. If a count event corresponding to the receipt of a packet containing twelve bytes is received, the example first stage counting module 122 would add twelve to the current byte count and increment the current packet count. Embodiments of first stage counting module 122 can update three or more subvalues in a similar fashion.

Figure 2:
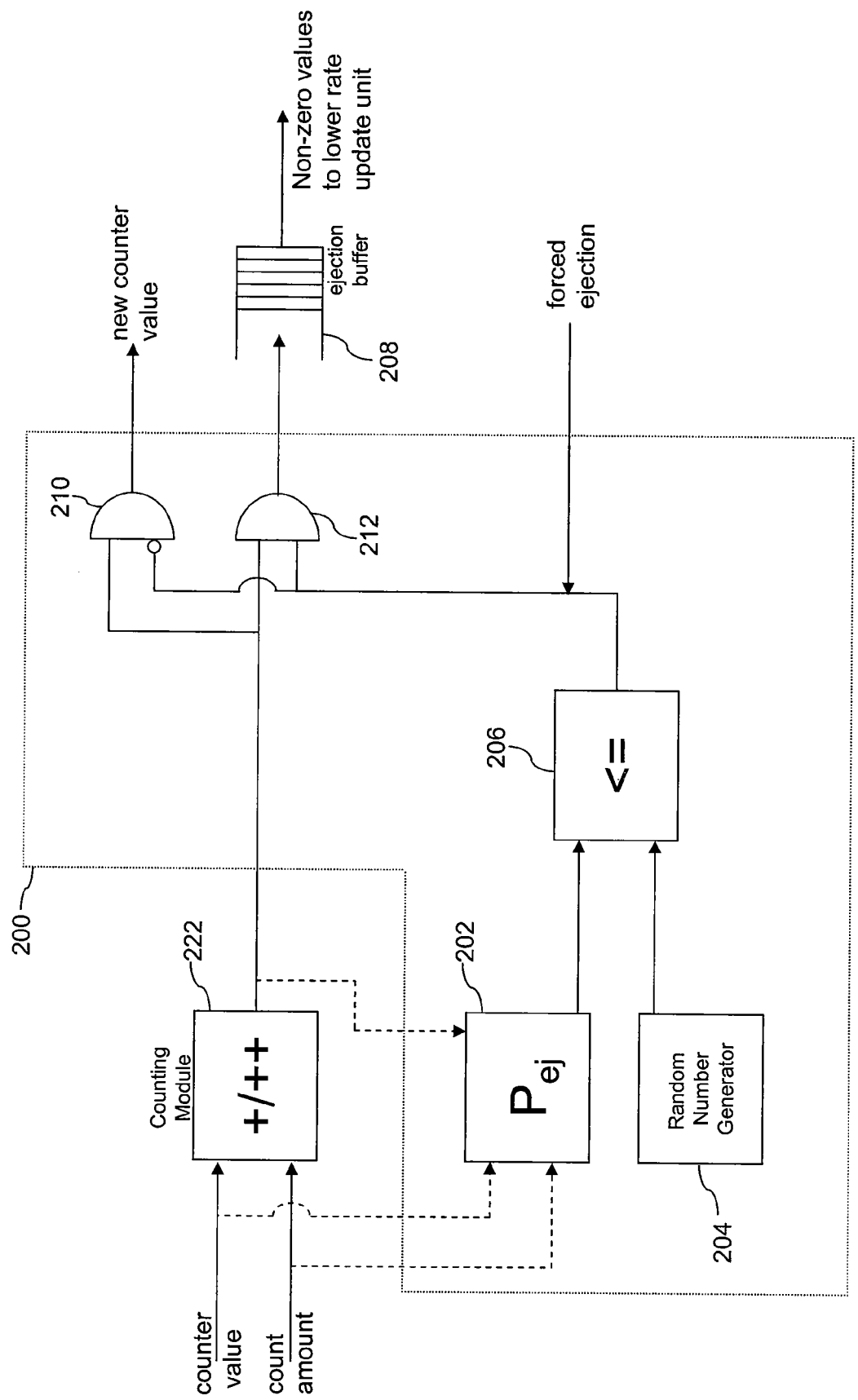
FIG. 2 shows an exemplary ejection module according to embodiments of the invention.

Ejection module 132 is described in detail in the description of FIG. 2, illustrating an exemplary ejection module 200. Ejection module 200 is a generalized ejection module 132.

First stage update unit 102 is interfaced to a second stage update unit 104. The interface between first stage update unit 102 and second stage update unit 104 may be buffered by an optional ejection buffer 108. In an embodiment, ejection buffer 108 is implemented as a first in first out (FIFO) queue. Ejection buffer 108 may be implemented in software or hardware.

In an embodiment, second stage update unit 104 is termed a "low rate update unit." Second stage update unit 104 comprises an optional second stage counter value interface module 114 and a second stage counting module 124. Second stage counter value interface module 114 provides an interface to an optional second stage storage device 144. Second stage storage device 144 may be any storage medium, including on-board cache, RAM, hard drive, etc. In an embodiment, second stage storage device 144 is low speed memory (e.g., dynamic random access memory (DRAM), secondary storage such as a disk drive, etc.).

An optional counter query management module 106 is interfaced to first stage update unit 102 and second stage update unit 104. The interface between counter query management module 106 and first stage update unit 102 may be buffered by an optional query buffer 110. In an embodiment, query buffer 110 is implemented as a first-in-first-out (FIFO) queue. Query buffer 110 may be implemented in software or hardware.

Figure 1B:
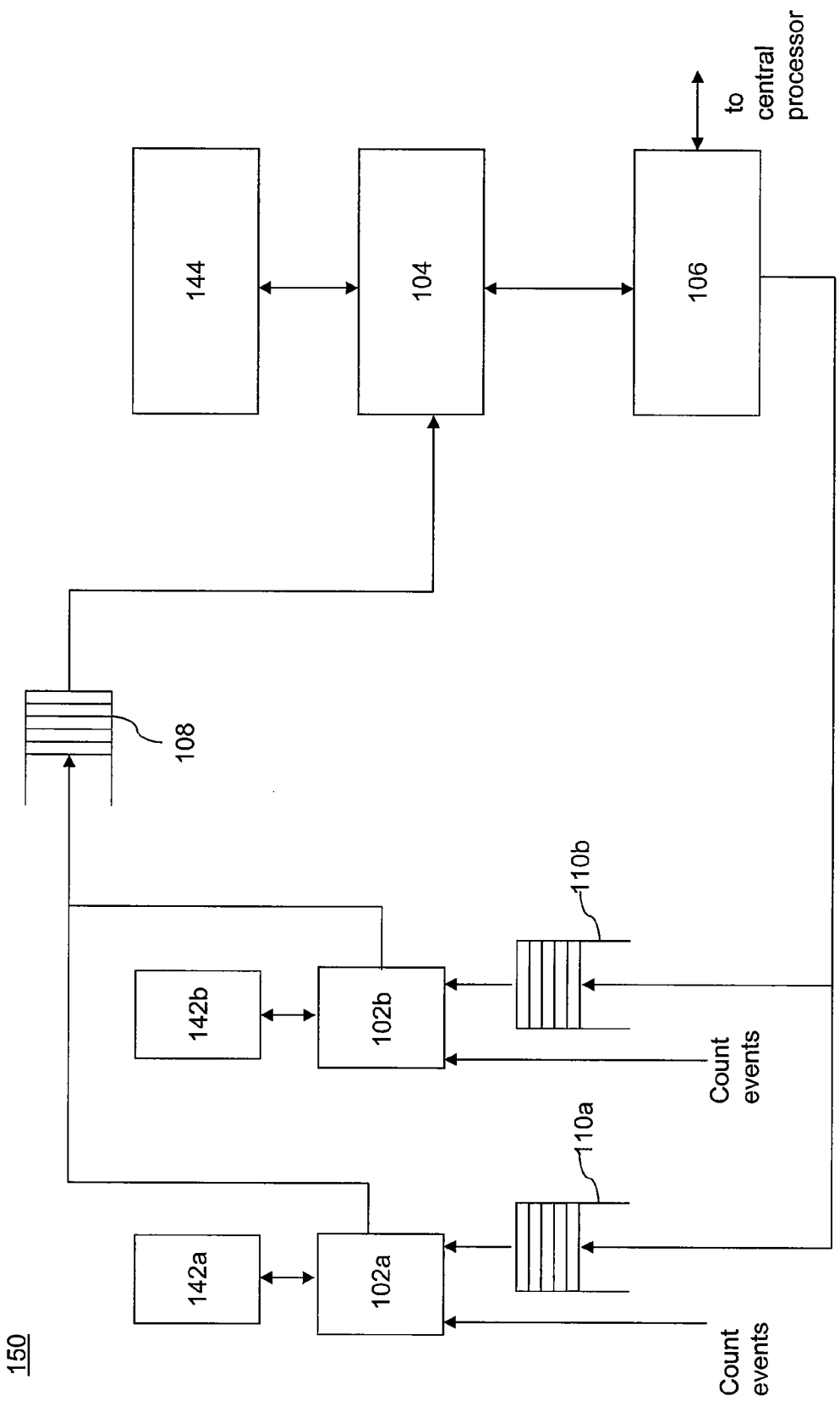

There is no requirement for a one-to-one correlation between first stage update units 102 and second stage update units 104. FIG. 1B illustrates a simple example of an embodiment of a counter management system 150 comprises a plurality of first stage update units 102 and a single second stage update unit 104. Other embodiments may contain different numbers of first and second stage update units.

An optional counter query module 106 may be interfaced to first stage update units 102 (update units 102a and 102b shown in FIG. 1B). Counter query module 106 may be directly interfaced or buffered by one or more optional query buffers 110. As shown, each first stage update unit 102 is interfaced to counter query module 106 via its own query buffer 110 (query buffers 110a and 110b shown in FIG. 1B). In another embodiment, a single query buffer 110 may be interfaced with one or more first stage update units 102. Each update unit 102 may be interfaced to an optional first stage storage device 142 (first stage storage devices 142a and 142b shown in FIG. 1B).

There is no requirement for a one to one ratio of storage devices to update units. Different embodiments of update units have one or more storage devices (e.g., on board cache, RAM, hard drives, etc.), internal processor storage only (e.g. registers), share storage devices with other update units, or any combination.

First stage update units 102a and 102b are interfaced to second stage update units 104 via an optional ejection buffer 108. As with query buffers, each update unit may have one or more ejection buffers, no ejection buffers, or may share ejection buffers with other update units. Second stage update unit 104 is interfaced with optional second stage storage device 144 and counter query module 106.

Thus, an embodiment of counter management system may be viewed as managing multiple two-stage counters, each counter having a low rate counter and a high rate counter. High rate update units each update one or more high rate counters. The high rate update units eject high rate counter values to one or more low rate update units. The sum of a high speed counter value and a low speed counter value is the total value of a particular two-stage counter.

In an embodiment, a counter management system 100 comprises a first stage update unit 102 implemented in a device that is connected to a larger system, and may be called a "device counter." A second stage update unit 104 is implemented in the center of a system and may be called a "system counter." In an embodiment, a counter management system comprises a plurality of device counters. In another embodiment, a counter management system comprises a plurality of system counters.

Figure 1C:
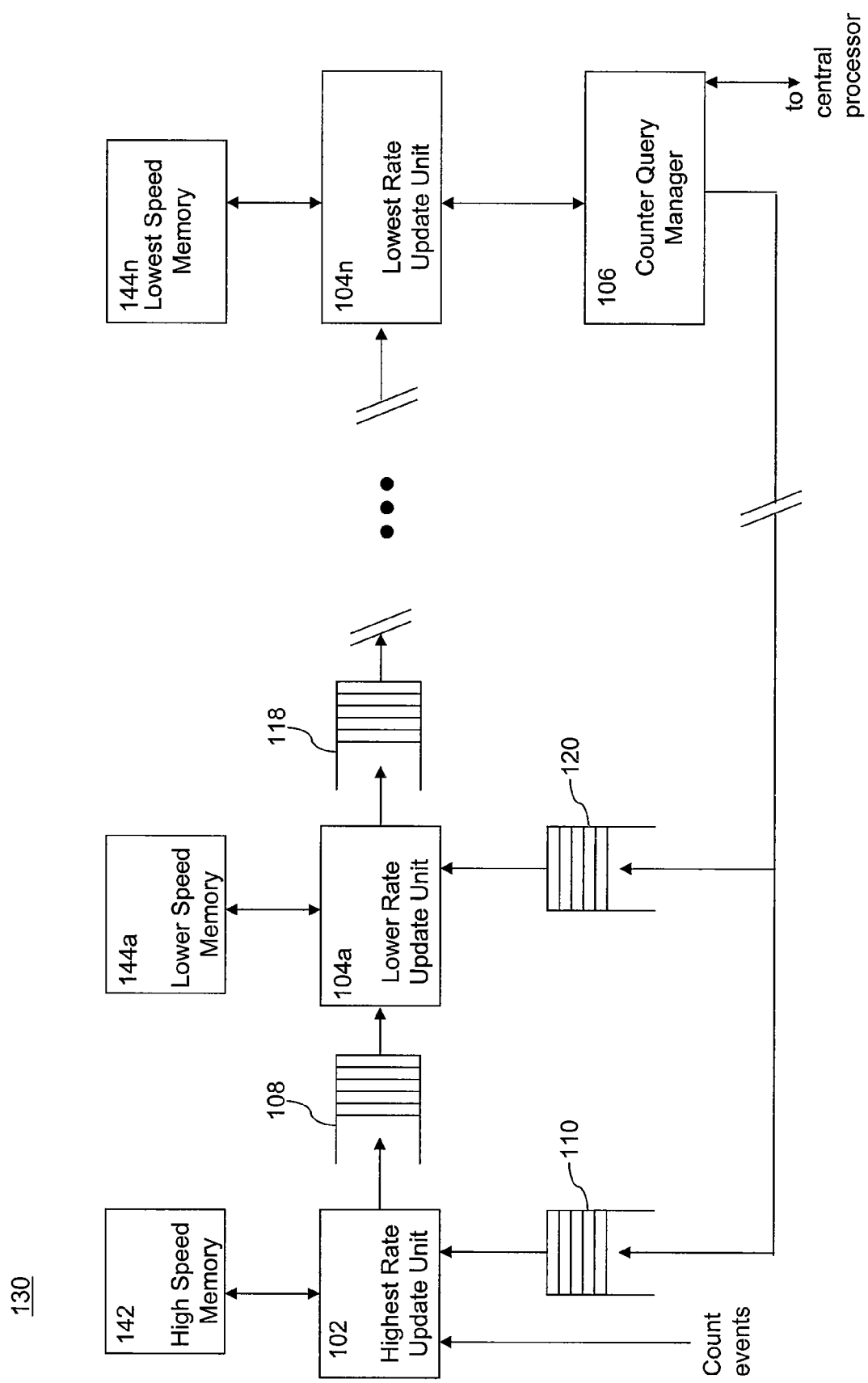

Counter management system 100 illustrates a two-stage counter management system. The two-stage concept may be expanded to multiple stages, e.g., a three or more stage system comprising highest stage, one or more middle stages, and lowest stage update units and optional storage devices. This is illustrated in FIG. 1C. The one or more middle stage update units and optional storage devices conceptually fit between the highest and lowest stage update units and optional storage devices. Instead of interfacing to the lowest rate update unit, the highest rate update unit interfaces to the next highest update unit, which interfaces to the next, and so on, until the next to lowest rate update unit interfaces to the lowest rate update unit. Optional ejection buffers may buffer these interfaces. Counter query module continues to interface with at least the highest rate update unit and the lowest rate update unit. This interface may still be buffered by optional query buffer 110. Each stage of update units may comprise one or more individual update units.

For example, FIG. 1C illustrates an exemplary multistage counter management system 130. Counter management system 130 may be implemented in hardware, software, or both. First stage update unit 102, optional first stage storage device 142, optional query buffer 110, and optional ejection buffer 108 are as described above. However, subsequent stages may be daisy-chained to form a n-stage counter. For example, second stage update unit 104a and second stage storage device 144a are essentially as described above (as unit 104 and device 144). Second stage update unit 104a may be interfaced via an ejection buffer 118 to subsequent stages. Counter query manager 106 is as described above, and may be optionally interfaced to second stage update unit 104a through optional query buffer 120, similar to query buffer 110. Zero, one, or more additional middle stages, which are not shown, would include similar optional query buffers, optional ejection buffers, update units, and storage devices. The last stage update unit 104n and last stage storage device 144n is similar to the second stage update unit 104 and second stage storage device 144 as described above. In an embodiment, these stages are referred to as the highest, lower, or medium, and lowest rate update units. In an embodiment, each stage's storage (from highest to lowest) has increasing capacity and decreasing speed and cost per unit of storage (e.g., fast RAM, slower, RAM, etc. to a disk drive).

Embodiments of counter management systems may have any combination these arrangements. Thus an embodiment of a counter management system may be viewed as managing a plurality of multiple-stage counters, each counter having at least two stages, and not necessarily the same number of stages.

General Operation

FIG. 3A shows flowchart 300 illustrating an exemplary method for managing a counter system. The steps may be performed in any order unless specified otherwise. Flowchart 300 will be discussed in the context of exemplary two-stage counter management system 100 to illustrate embodiments of the invention, but is not so limited.

In step 310, a count event is received. In an embodiment, the count event is received by example counter management system 100 at a first stage update unit 102. In an embodiment, the count event comprises a specification of which counter's value will be updated. For example, an embodiment of first stage update unit 102 might be capable of updating different counters depending on the count event received. Thus, the count event could include a counter identification. In an embodiment, the counter identification includes a specification of more than one counter, e.g., a packet counter and a byte counter.

In an embodiment, the count event comprises explicit or implicit information about the event to be counted. For example, the count event may include a data packet length signifying that a packet of the given length is to be counted.

In step 320, the first stage counter value or subvalues are updated, i.e., the received event is counted. In an embodiment, a first stage counter value or subvalue is updated directly by first stage update unit 102 (e.g., a first stage counter value or subvalue is maintained in a register). In an embodiment, a first stage counter value or subvalue to be updated by first stage update unit 102 is stored in first stage storage device 142. In that case, the first stage counter value or subvalue is read from a first stage counter location and updated. If multiple first stage counter subvalues are updated, some may be updated directly and some may be read from first stage storage device 142. The updated first stage counter value or subvalues do not need to be written back to the first stage counter location(s) at this time.

In an embodiment, the updating of step 320 is simply an increment of the first stage counter value. In another embodiment, the counting is an accumulation of a value to the first stage counter value. In yet another embodiment, the counting is both: a subvalue is incremented and number is accumulated to another subvalue. In an embodiment, the first subvalue is the value of a corresponding packet counter and the second subvalue is the value of a corresponding byte counter. The first subvalue is incremented, and the packet length in bytes is accumulated to the second subvalue.

For example, a byte counter simply increments if the count event signifies the receiving or sending of a byte. For a packet, however, a packet length in bytes would accumulate to the byte counter (e.g., if a packet of 15 bytes is received, the updating would comprise adding 15 to the byte counter). Thus, the counting of a packet may include both incrementing a packet counter and accumulating the packet length to a byte counter.

FIG. 3B shows flowchart 321 illustrating an embodiment of step 320. The steps may be performed in any order unless specified otherwise. Depending on what is being counted, the updating of each subvalue may be either an accumulation, where a value is added to the subvalue, or simply an incrementing of the subvalue. In an embodiment, a subvalue is incremented. For example, the subvalue is the value of a corresponding packet counter and the event signifies a packet was received. In another embodiment, a value depending on the content of the count event is accumulated to the first subvalue. For example, the subvalue is the value of a corresponding byte counter and the event signifies that a packet containing some number of bytes was received. In that example, the number of bytes in the received packet is added to the subvalue. In step 322, a first subvalue is updated. In step 324, second subvalue is updated. This process may continue for any number of subvalues. Thus, in step 328, a value depending on the content of the count event is accumulated to the $n^{th}$ subvalue. Thus, the updating of the first stage counter in step 320 may include the updating of n subvalues.

In decision step 330 of flowchart 300 (in FIG. 3A), a decision is made whether to eject the first stage counter. This decision is discussed in detail elsewhere herein. If the first stage counter is to be ejected, proceed to step 350. If not, proceed to step 340.

In step 340, the updated first stage counter value is written back to the first stage counter location, if needed (i.e., it is stored in a storage device). Proceed to step 310 to process the next received count event.

In step 350, the first stage counter is ejected. FIG. 3D shows flowchart 351 illustrating an exemplary method for ejecting a counter. The steps may be performed in any order unless specified otherwise. In step 352, a stage's counter value is accumulated to a counter value in the next stage update unit (e.g., a counter value at a first stage update unit 102 is accumulated to a second stage update unit 104). In an embodiment, the identification of the multistage counter being updated (as specified by the count event in step 310) is also passed to the next stage update unit. The ejection interface between the update units (e.g., first stage update unit 102 and second stage update unit 104) may be buffered by ejection buffer 108.

As discussed above, a stage's counter may include multiple subcounters, and the corresponding counter value includes corresponding multiple subvalues. Thus, each subvalue of the first stage counter value must be accumulated to the corresponding subvalues of the second stage counter. For example, if a stage's counter comprising a byte counter and a packet counter is ejected, then the first byte counter's value must be accumulated to the second byte counter's value, and the first packet counter's value must be accumulated to the second packet counter's value. In step 354, the stage's counter is cleared (i.e., zeroed). In an embodiment, zero values are written to the stage's counter at its counter location. In further embodiments, some or all subcounters (e.g., byte counter and packet counter) of the stage's counter are zeroed.

In optional step 360, a multistage counter is queried. For example, an entity requests a total current value, and counter management system 100 returns a total value for the counter. In an embodiment, the query specifies which multistage counter is being queried, e.g., counter system 100 manages multiple multistage counters and the query event includes a counter identification. The details of the query process are described in detail elsewhere herein.

Ejection and Ejection Determination

In an embodiment, a stage's counter is ejected from an update unit of a counter management system responsive to a determination based on a random function of the counter's expiration. A counter's expiration is a function of its value and its range. The resulting "probability" curve may be any curve desired. Any function may be approximated by predetermined values residing in a look-up table, thus the probability function does not need to be calculated in real time; it can be implemented as a table look-up.

The following examples illustrate this concept with example embodiments and do not limit the scope of the invention.

In an embodiment, an expiration is defined as:

$$E = C_{range} - C \quad (EQ1)$$

where E is a counter's expiration, $C_{range}$ is the counter's range, and C is the counter's current value. Thus the expiration is the range less the current value, and is a function of the counter's state.

In an embodiment, a probability of ejection is defined to be inversely proportional to the counter's expiration. For example:

$$P_{ej}(C) = \frac{1}{C_{range} - C + 1} \quad (EQ\ 2)$$

where $P_{ej}$ is the probability of ejection. The 1 is added to the denominator so that when the counter reaches its range, the probability of ejection is 1 and not infinite.

This term is called a probability as it can be compared to a random or a pseudo-random number to determine whether to eject the counter. The probability that a counter is not ejected is simply $(1-P_{ej})$. Thus, the probability that a counter is not ejected upon reaching a given value C is:

$$\overline{P_{ej}}(C) = \frac{C_{range} - C}{(C_{range} - C + 1)} \quad (EQ\ 3)$$

To simplify this example, we assume for now that the counter is incremented only and does not accumulate values (e.g., a packet counter). The probability that a counter reaches a given value C is the product of the probabilities of not being ejected for each value up to C, that is, $$P_{value}(C) = \prod_{i=1}^{C} \overline{P_{ej}}(i) = \frac{C_{range} - C}{C_{range}} \quad (EQ\ 4)$$

where $P_{value}(C)$ is the probability of reaching a counter value of C.

In this example, the probability of an ejection message at C is the product of the probability of achieving a value of (C−1) i.e., making it to (C−1) without being ejected, multiplied by the probability of being ejected on the very next, i.e., the $C^{th}$ count event. This reduces to $1/C_{range}$:

$$P_{msg}(C) = P_{value}(C-1) * P_{ej}(C) \quad (EQ\ 5)$$
$$= \frac{C_{range} - (C-1)}{C_{range}} * \frac{1}{C_{range} - C + 1}$$
$$= \frac{1}{C_{range}}$$

Thus, all ejection value messages are equally likely. By randomizing the counter ejection process as described, the probability of a given ejection value message is uniform. Moreover, at a constant count rate, each message defines the time elapsed since the last message. The ejection process is effectively memoryless, thus, when dealing with a large number of counters the ejection process can be fairly modeled as a Poisson process.

Note that for this exemplary embodiment, the average ejection value message is the sum of the proportional contributions for each counter to be ejected, which reduces to roughly one half $C_{range}$:

$$C_{avg} = \sum_{i=1}^{C_{range}} iP_{msg}(i) = \sum_{i=1}^{C_{range}} \frac{i}{C_{range}} = \frac{1}{C_{range}} \sum_{i=1}^{C_{range}} i = \frac{C_{range} + 1}{2} \quad (EQ\ 6)$$

A similar analysis applies in the more complicated case of an accumulating counter. If the counter accumulates a value n that is larger than one (e.g., a byte counter accumulating packet length n for each count event), the probability of an ejection message at C is the product of the probability of reaching (C−n) multiplied by the probability of being ejected at the next event, i.e., when the counter value reaches C. Thus:

$$P_{value}(C) = \overline{P_{ej}}(C) * P_{value}(C-n) \quad (EQ\ 7)$$

and thus:

$$P_{ej}(C, n) = 1 - \frac{P_{value}(C)}{P_{value}(C-n)} = \frac{n}{(C_{range} - C + n)} \quad (EQ\ 8)$$

where $P_{ej}(C,n)$ is the general ejection probability of an ejection message at C for a counter accumulating value n. Variable accumulation values are also possible and handled similarly.

In real systems, many counters are typically being updated which leads to exponentially distributed inter-arrival times for ejection events. For this and other reasons, there may be a rapid succession of ejections from a given ejection module. Thus a buffer may be needed. In an embodiment, an ejection buffer, such as ejection buffer 208 illustrated in FIG. 2, may be used. Ejection buffer 208 may be implemented in software or hardware. In an embodiment, ejection buffer 208 is implemented as a FIFO queue. One exemplary embodiment of ejection buffer 208 is ejection buffer 108 as shown in FIG. 1 and described elsewhere herein.

Embodiments of an ejection module eject a counter based on a random function of the counter's expiration. Embodiments may be implemented in hardware, software, or a combination thereof. FIG. 2 illustrates an exemplary ejection module 200 according to embodiments of the present invention. In embodiments, ejection module 200 receives a counter value. Ejection module 200 comprises a probability module 202, a random number generator 204, a comparison module 206, new counter value module 210 and ejected value module 212.

Ejection module 200 receives a counter value. Optionally, it may also receive additional information (e.g., "count amount") based on the count event received by the update unit. As discussed elsewhere within, in an embodiment, a count event includes explicit or implicit information about the event to be counted. For example, the count event may include a data packet length signifying that a packet is to be counted of the given length. Thus, the count amount for a byte counter may be the packet length in bytes.

Ejection module 200 also optionally receives an updated counter value from a counting module 222. In an example embodiment, an ejection module 200 is ejection module 132 in first stage update unit 102. In that example, an embodiment of counting module 222 is implemented as counting module 122. In other embodiments, however, embodiments of ejection module 200 are implemented in other update units and receive updated counter values from other counting modules 222. In embodiments, a counter value comprises a plurality of subvalues. One, all, or none of the subvalues may be ejected, zeroed, etc., as described herein.

In an embodiment, probability module 202 determines an output based on a function of the counter expiration. As described elsewhere within, counter expiration is a function of the counter's range and its current value. Thus, an example probability module 202 receives a current counter value as an input and determines an output based on the current counter value and the counter's range. The output may be determined by any method, including calculations and table look-ups.

The current counter value used by probability module 202 may be either the counter value before or after the counter value update currently in progress. If the count amount is constant (e.g., the number of bytes in a packet) or equal to one (i.e., the counter simply increments), the probability module 202 can deduce the updated counter value from the previous value or simply use the pre-updated counter value. Conversely, the output of counting module 222 includes the updated counter value and may be used. Thus, in embodiments, this current value input may be a direct input of the pre-event counter value, a direct input of the pre-event counter value and the current count amount (e.g., for a byte counter, the packet length), or the output of counting module 222. Probability module 202 outputs to comparison module 206. An embodiment of an ejection module capable of independently ejecting subvalues may have more than one output from one or more of probability module 202, random number generator 204, and comparison module 206.

In embodiments, random number generator 204 determines a random number or a pseudo-random number. Random number generator 204 outputs to comparison module 206. Comparison module 206 compares the output of probability module 202 and random number generator 204. In an embodiment, the comparison is whether probability module 202 output is less than or equal to random number generator 204 output. Mathematically equivalent comparisons (e.g., greater than with inputs reversed) and other comparisons may be used (e.g., less than) in embodiments. Comparison module 210 outputs to new counter value module 210 and ejection value module 212.

In an embodiment, an ejection module always outputs a new counter value, regardless whether the value is to be ejected. The new counter value may be zero when the counter will be cleared. In an embodiment, an ejection module outputs a message indicating that the counter should be cleared. In the example illustrated by ejection module 200, an updated counter value is output when the counter value is not ejected, and a cleared value (e.g., zero) when it is ejected. A new counter value module 210 performs this function. In an embodiment, new counter value module 210 is implemented with an AND gate module. Each bit of the updated counter value is ANDed with an inverted signal, the signal being the output of comparison module 206. Thus, each bit is zero if comparison module 206 signals an eject, but retains its value (1 or 0) if comparison module 206 does not signal an eject. New counter value module 210 may be implemented in other hardware arrangements, in software, or a combination thereof.

Similarly, in embodiments, an ejection module always outputs an ejected counter's value. The ejected counter's value (or subvalue) is nonzero only when that value or subvalue is being ejected. In other embodiments, an ejection module signals or outputs a message that an ejection has occurred and contains the ejection. In one embodiment illustrated by ejection module 200, an nonzero ejected value is output upon ejection, otherwise the output is zero. An ejection value module 212 performs this function. In an embodiment, ejection value module 212 is implemented with an AND gate module. Each bit of the updated counter value is ANDed with the output signal of comparison module 206. Thus, each bit is zero unless comparison module 206 signals an ejection. If comparison module 206 signals an ejection, then each bit retains its value (1 or 0). Ejection value module 212 may be implemented in other hardware arrangements, in software, or a combination thereof.

Ejection module 200 may be sent a forced ejection signal, for example, on a counter query. In an embodiment, the forced ejection signal forces the output line of comparison module 206 to indicate an ejection.

FIG. 3C shows flowchart 331 illustrating an example method of determining whether to eject a counter. The steps may be performed in any order unless specified otherwise. This method is applicable to a simple two-stage counter management system 100 or to a multi-stage counter. Flowchart 331 will be discussed in the context of exemplary counter management system 100 and exemplary ejection module 200 to illustrate embodiments of the invention. Thus, the discussion of flowchart 331 will center on illustrating an example embodiment of comparison step 330 in flowchart 300 shown in FIG. 3A. As described elsewhere herein, a decision is being made in step 330 whether to eject the first stage counter. Embodiments of this method apply to other contexts where a decision is being made to eject any counter.

In step 332, a probability of ejection is determined using the counter expiration. Embodiments of step 332 calculate the probability of ejection in accordance with equations described elsewhere within. An example embodiment uses EQ 2. Another example embodiment uses EQ 8. Yet another example embodiment uses EQ 8 and EQ 2 to calculate multiple probabilities of ejection based on subvalues of the counter value, e.g., a probability of ejection for a byte counter subvalue, which accumulates each packet length, and a probability of ejection for the packet counter subvalue, which increments on each packet. Other embodiments implement an approximation based on table look-ups.

In step 334, a "random" number or numbers is generated. The number(s) generated may be pseudo-random number(s). One or more numbers may be generated in this step.

In step 336, the probability of ejection is compared to a random (or pseudo-random) number. Step 336 determines whether the counter (or which subcounters) are ejected. In this step, the probability, or multiple probabilities, are compared to the number generated in step 334. The comparison may include multiple probabilities compared to single generated number, each probability may be compared to different random number, or any combination thereof. The result of step 336 may be that the counter is ejected, some subcounters will be ejected, all subcounters will be ejected, or that no ejection(s) will occur.

Example Multi-stage Counter Management System and Operation

Figure 4:
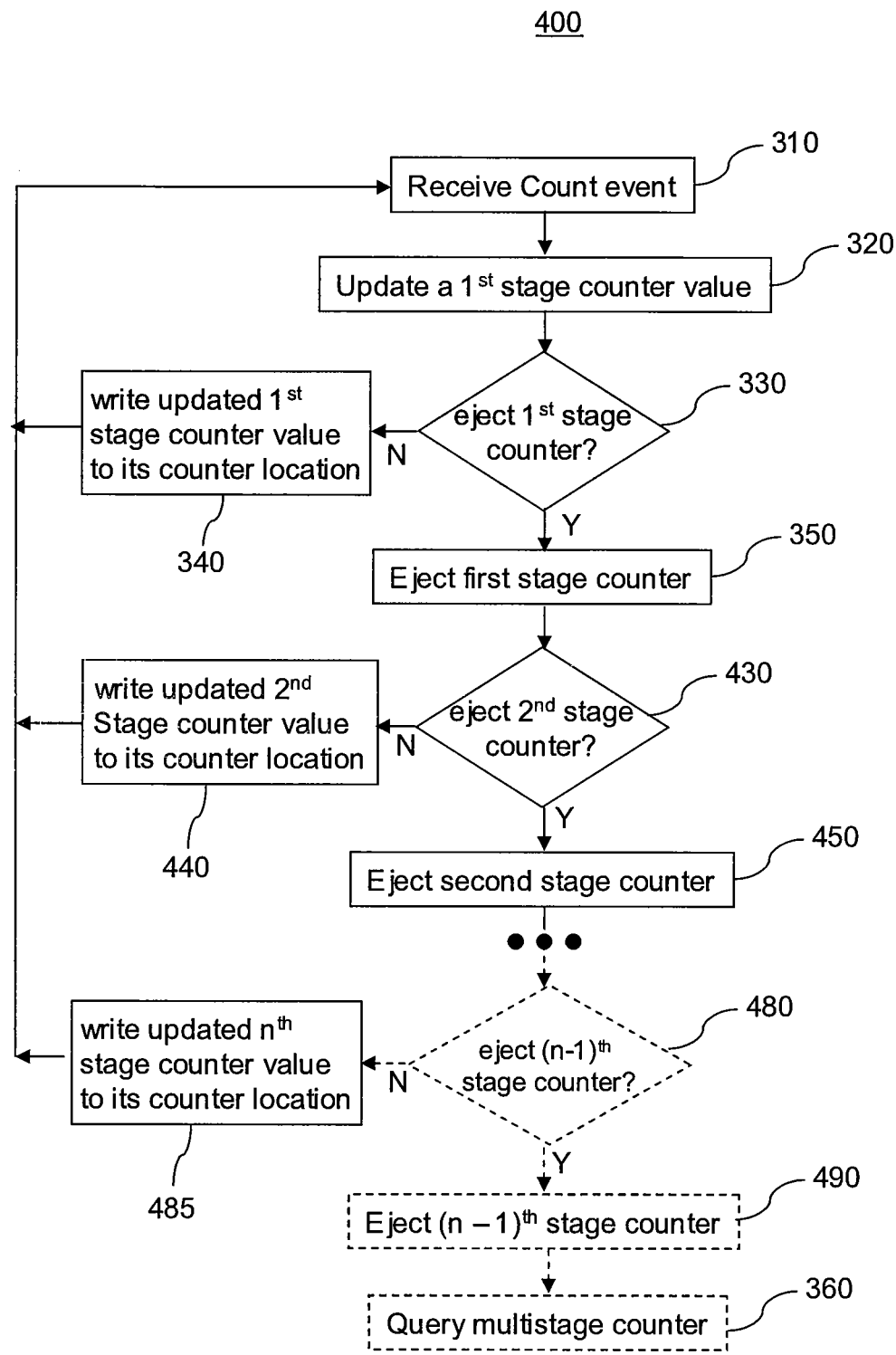
FIG. 4 shows flowchart 400, illustrating an exemplary method for managing a counter system according to embodiments of the invention.

As described elsewhere within, counter management system 100 can be expanded into a multistage counter management system. FIG. 4 shows flowchart 400 illustrating an exemplary method of managing a multi-stage counter management system. The steps may be performed in any order unless specified otherwise.

In step 310, a count event is received by the counter management system. Step 310 is discussed in the context of a two-stage counter management system 100 embodiment elsewhere herein, and the same principles apply in a multi-stage embodiment of a counter management system.

In step 320, a first stage counter value is updated. Step 320 is discussed in the context of a two-stage counter management system 100 embodiment elsewhere herein, and the same principles apply in a multi-stage embodiment of a counter management system.

In decision step 330, a decision is made whether to eject the first stage counter. Step 330 is discussed in the context of a two-stage counter management system 100 embodiment elsewhere herein, and the same principles apply in a multi-stage embodiment of a counter management system. If the first stage counter is to be ejected, proceed to step 350. If not, proceed to optional step 340 or, if optional step 340 is not applicable, directly to step 310 to process the next received count event.

In optional step 340, the updated first stage counter value is written back to the first stage counter location. Optional step 340 is discussed in the context of a two-stage counter management system 100 embodiment elsewhere herein, and the same principles apply in a multi-stage embodiment of a counter management system.

In step 350, the first stage counter is ejected—the first stage counter value is accumulated to the second stage update unit, optionally through an ejection buffer, and the first stage counter is cleared. Step 350 is discussed in the context of a two-stage counter management system 100 embodiment elsewhere herein, and the same principles apply in a multi-stage embodiment of a counter management system.

In step 430, a decision is made whether to eject the second stage counter. Step 430 is similar to step 330, and the same principles apply. Although the second stage update unit did not receive a count event, the accumulation of the first stage counter value is conceptually similar. The "count event" is analogous to the ejection from the first stage counter. If the second stage counter is to be ejected, proceed to step 450. If not, proceed to step 440.

In step 440, the updated second stage counter value(s) are written back to the second stage counter location(s) as necessary. Step 440 is similar to step 340, and the same principles apply. Proceed to step 310 to process the next received count event.

In step 450, the second stage counter is ejected—the second stage counter value is accumulated to the third update unit, optionally through an ejection buffer, and the second stage counter is cleared. Step 450 is similar to step 350, and the same principles apply.

Steps 480, 490, and step 485 operate similarly to the equivalent steps in the first two stages. These steps apply to stages 3 to (n−1), where n is the total number of stages in the counter management system. In an embodiment, stage n does not eject, as there is not further stage to receive the ejection.

In step 480, a decision whether to eject the stage's counter is made. Step 480 is equivalent to steps 450 and 350. If the stage's counter is to be ejected, proceed to step 490. If not, proceed to step 485.

In step 485, the stage's updated counter value is written to the stage's counter location for that counter if necessary. Step 485 is equivalent to steps 440 and 340. Proceed to step 310 to process the next received count event.

In step 490, the stage's counter is ejected—the stage's counter value is accumulated to the next stage's update unit, optionally through an ejection buffer, and the stage's counter is cleared.

In optional step 360, the multistage counter is queried. Optional step 360 is discussed in the context of a two-stage counter management system 100 embodiment elsewhere herein, and the same principles apply in a multi-stage embodiment of a counter management system.

Example Multistage Counter Query

Figure 5:
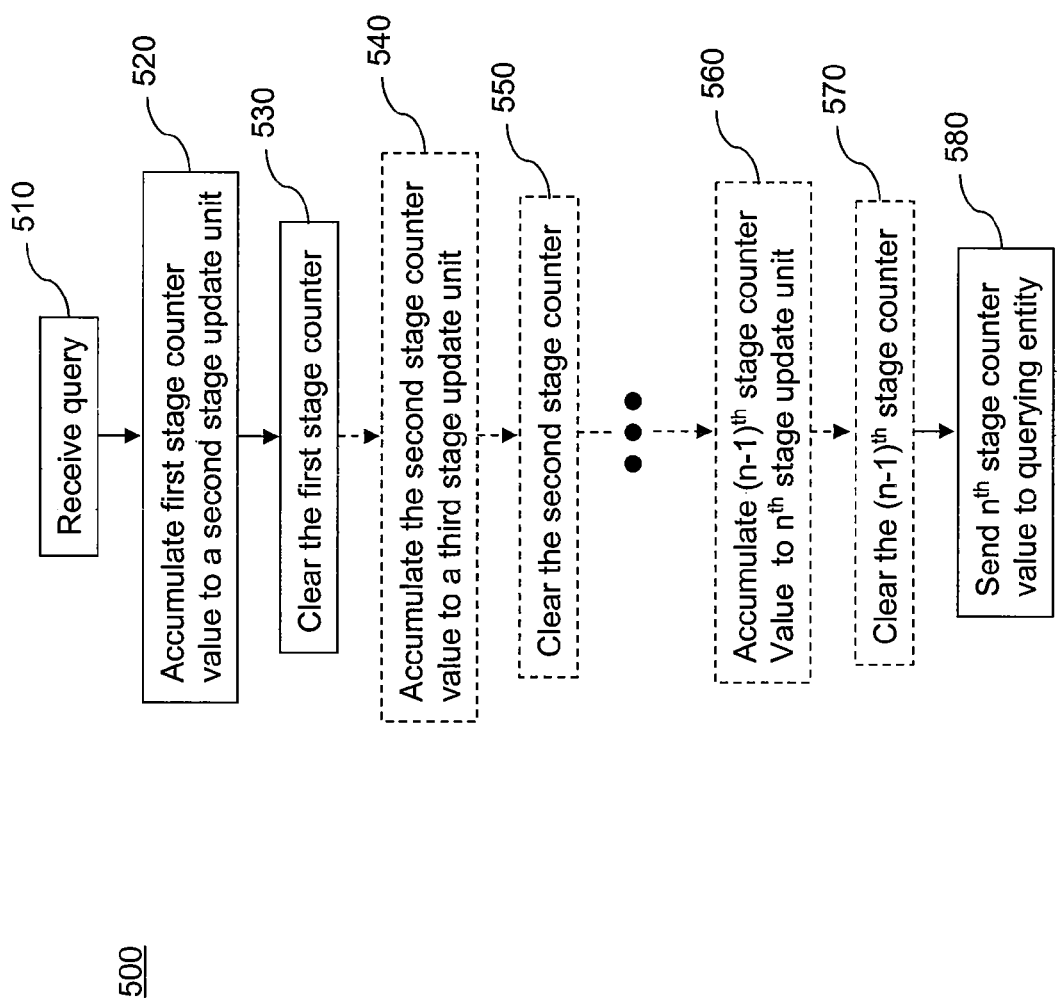
FIG. 5 shows flowchart 500, illustrating an exemplary method of querying a multistage counter according to embodiments of the invention.

FIG. 5 shows flowchart 500 illustrating an exemplary method of querying a multistage counter of n stages. The steps may be performed in any order unless specified otherwise. In an embodiment, the query process is essentially a series of sequential forced ejections of each stage and a read of the last. Thus, the first stage update unit ejects to the second stage, which ejects to the third stage, and so on. Because ejections include accumulating a counter value to the next stage's update unit and zeroing the counter, the end result is that the last ($n^{th}$) stage receives the most up-to-date counter value for that counter which can then be read.

Thus, a two-stage counter management system (e.g., counter management system) need only perform steps 510, 520, 530, and 580. A three-stage counter management system would perform steps 510-550 and 580. Larger counter management systems would perform those steps, plus 560 and 570 for the remaining middle stages. For example, a ten-stage counter management system would perform steps 510-550, steps 560 and 570 for stages 3-9, and step 580.

The accumulation steps are performed sequentially. Using a ten-stage embodiment of a counter management system as an example, step 520 is performed before step 540, which is performed before step 560, which is performed before step 560 for stage 4, and so on to stage 9. There is no such restriction on the order of performance of the counter clearing steps (i.e., 530, 550, and 570).

In step 510, a counter management system receives a query. In an embodiment, the query originates from a central processor, and is received by a counter query module. In an embodiment illustrated by counter management 100, counter query module 106 receives the query.

In an embodiment, counter query module initiates the query process in a counter management system. The counter query module sends a query event to a first stage update unit. In yet another embodiment, the counter query module enqueues the query to a query buffer, for example, query buffer 110. The counter query module may coordinate the entire query process or it may simply send to the first stage update unit. In an embodiment without a counter query module, a first stage update unit receives the query directly or via a query buffer. In embodiments, the accumulation events described in the following steps may be accompanied by a message to trigger the appropriate response in the next update unit.

The query may include a specification of which counter (of the multiple counters being managed) is being queried. In an embodiment, the query includes a specification of more than one counter being queried (e.g., a byte counter and a packet counter).

In step 520, the specified counter value or values are accumulated from a first stage update unit to a second stage update unit. This step may include passing the identity of the which counter is being queried. In an embodiment, a counter value is accumulated directly, e.g., the stage's counter is stored in a register. In another embodiment, a stage's counter value to be accumulated is stored in a storage device. In that case, the counter value is read from the storage location. The ejecting may be a combination of both direct ejection and ejections of values read from storage devices. The description of step 352 contains further details regarding the accumulation performed in step 520.

In step 530, the specified first stage counter (or sub-counters) are cleared (e.g., set to zero). The description of step 354 contains further details regarding clearing counters.

In optional step 540, the second stage counter value or subvalues are accumulated from the second stage to the third stage. This step is analogous to step 520.

In optional step 550, the second stage counter (or sub-counters) are cleared (e.g., set to zero). This step is analogous to step 530.

In optional step 560, the $(i-1)^{th}$ stage counter value or subvalues are sequentially accumulated to the $i^{th}$ stage, for all i between 3 and (n−1), where n is the total number of stages. For each of those stages, this step is analogous to step 50.

In optional step 570, the $i^{th}$ stage counters or subcounters are cleared, for all i between 3 and (n−1). For each of those stages, this step is analogous to step 550.

In step 580, the final stage's counter value or subvalues is sent to the querying entity. As a result of the preceding steps, the final $(n^{th})$ stage has the totaled counter value or subvalues which were requested in the query. In embodiments with an optional counter query module, the totaled counter value or subvalues are sent to the counter query module, which in turn, sends them (or makes them available) to the requesting entity. In embodiments without an optional counter query module, the final $(n^{th})$ update unit performs that task.

Example Computer System Implementation

Various aspects of the present invention can be implemented by software, firmware, hardware, or a combination thereof. Calculations may be approximated using table lookups. Hardware implementations of individual components are not limited to digital implementations and may be analog electrical circuits. Additionally, embodiments may be realized in a centralized fashion in at least one communication system, or in a distributed fashion where different elements may be spread across several interconnected communication systems. Any kind of computer system or other apparatus adapted for carrying out the methods described herein may be suited.

Figure 6:
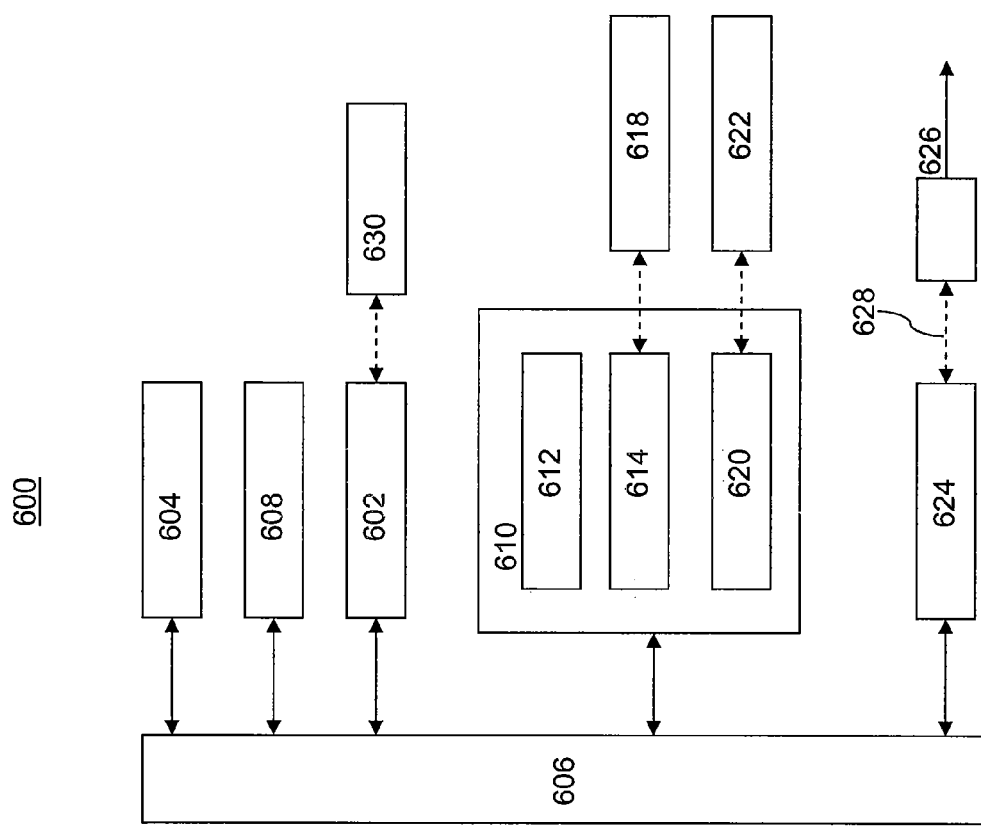
FIG. 6 shows an example computer system in which embodiments of the present invention may be implemented.

FIG. 6 illustrates an example computer system 600 in which the present invention, or portions thereof, can be implemented as computer-readable code. For example, the methods illustrated by flowcharts 300 of FIG. 3, 321 of FIG. 3B, 331 of FIG. 3C, 351 of FIG. 3D, 400 of FIGS. 4, and 500 of FIG. 5 can be implemented in system 600. Various embodiments of the invention are described in terms of this example computer system 600. After reading this description, it will become apparent to a person skilled in the relevant art how to implement the invention using other computer systems and/or computer architectures.

Computer system 600 includes one or more processors, such as processor 604. Processor 604 can be a special purpose or a general purpose processor. Processor 604 is connected to a communication infrastructure 606 (for example, a bus or network).

Computer system 600 also includes a main memory 608, preferably random access memory (RAM), and may also include a secondary memory 610. Secondary memory 610 may include, for example, a hard disk drive 612, a removable storage drive 814, and/or a memory stick. Removable storage drive 614 may comprise a floppy disk drive, a magnetic tape drive, an optical disk drive, a flash memory, or the like. The removable storage drive 614 reads from and/or writes to a removable storage unit 618 in a well known manner. Removable storage unit 618 may comprise a floppy disk, magnetic tape, optical disk, etc. which is read by and written to by removable storage drive 614. As will be appreciated by persons skilled in the relevant art(s), removable storage unit 618 includes a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to computer system 600.

Computer system 600 may also include a communications interface 624. Communications interface 624 allows software and data to be transferred between computer system 600 and external devices. Communications interface 624 may include a modem, a network interface (such as an Ethernet card), a communications port, a PCMCIA slot and card, or the like. Software and data transferred via communications interface 624 are in the form of signals which may be electronic, electromagnetic, optical, or other signals capable of being received by communications interface 624. These signals are provided to communications interface 624 via a communications path 626. Communications path 626 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 618, removable storage unit 622, and a hard disk installed in hard disk drive 612. Signals carried over communications path 626 can also embody the logic described herein. Computer program medium and computer usable medium can also refer to memories, such as main memory 608 and secondary memory 610, which can be memory semiconductors (e.g. DRAMs, etc.). These computer program products are means for providing software to computer system 600.

Computer programs (also called computer control logic) are stored in main memory 608 and/or secondary memory 610. Computer programs may also be received via communications interface 624. Such computer programs, when executed, enable computer system 600 to implement the present invention as discussed herein. In particular, the computer programs, when executed, enable processor 604 to implement the processes of the present invention, such as the steps in the methods illustrated by flowcharts 300 of FIG. 3, 321 of FIG. 3B, 331 of FIG. 3C, 351 of FIG. 3D, 400 of FIGS. 4, and 500 of FIG. 5 discussed above. Accordingly, such computer programs represent controllers of the computer system 600. Where the invention is implemented using software, the software may be stored in a computer program product and loaded into computer system 600 using removable storage drive 614, interface 620, hard drive 612 or communications interface 624.

The invention is also directed to computer program products comprising software stored on any computer useable medium. Computer programs or software in the present context means any expression, in any language, code or notation, of a set of instructions intended to cause a system having an information processing capability to perform a particular function either directly or after either or both of the following: a) conversion to another language, code or notation; b) reproduction in a different material form. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

Conclusion

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for managing a counter system including a counter having a first stage update unit coupled to a second stage update unit, the first stage update unit and the second stage update unit being characterized by a first stage counter value having a plurality of bits and a second stage counter value, respectively, wherein the first stage update unit and the second stage update unit include a first plurality of subcounters and a second plurality of subcounters, respectively, and wherein a first subcounter and a second subcounter from among the first plurality of subcounters are characterized by a first subvalue having a first set of bits from among the plurality of bits and a second subvalue having a second set of bits from among the plurality of bits, respectively, the method comprising:

receiving a count event associated with the counter;

updating the first stage counter value based on the count event;

determining whether to eject the first stage counter value from the first stage update unit to the second stage update unit based on a random function of an expiration of the first stage update unit;

responsive to the determination to eject the first stage counter value, ejecting the plurality of bits from the first stage update unit to the second stage update unit; and updating the first subvalue and the second subvalue of the first stage update unit based on the count event.

2. The method of claim 1, wherein the ejecting comprises: clearing the first stage counter value; and
accumulating the plurality of bits to the second stage counter value.

3. The method of claim 2, wherein the ejecting further comprises:
sending a counter ejection message.

4. The method of claim 1, wherein the ejecting comprises: clearing the first stage counter value;
enqueuing the plurality of bits; and
accumulating the plurality of bits to the second stage counter value.

5. The method of claim 4, wherein the enqueuing comprises:
enqueuing the plurality of bits to a first in first out (FIFO) queue in communication with the second stage update unit.

6. The method of claim 1, wherein the ejecting comprises: clearing the first subvalue and the second subvalue; and
accumulating the first set of bits and the second set of bits to a first subvalue of a first subcounter from among the second plurality of subcounters and a second subvalue of a second subcounter from among the second plurality of subcounters, respectively.

7. The method of claim 1, wherein the determining comprises:
determining whether to eject the first stage counter value based on the random function of the expiration of at least one subcounter from among the first plurality of subcounters.

8. The method of claim 1, wherein the receiving comprises:
receiving the count event that specifies the first stage update unit.

9. The method of claim 1, wherein the updating the first stage counter value based on the count event comprises:
reading the first stage counter value from a storage device.

10. The method of claim 9, further comprising:
writing the plurality of bits to the storage device if the plurality of bits were not ejected.

11. The method of claim 1, further comprising:
answering a query, the answering including:
receiving a query;
accumulating the plurality of bits to the second stage update unit; and
clearing the plurality of bits.

12. The method of claim 1, wherein the expiration is based on a range of the first stage update unit and the first stage counter value.

13. The method of claim 1, wherein the determining comprises:
 determining a probability of ejection based on the expiration;
 generating a number; and
 comparing the number to the probability of ejection.

14. The method of claim 13, wherein the number is a pseudo-random number.

15. The method of claim 13, wherein the number is a random number.

16. The method of claim 13, wherein the determining the probability of ejection is performed using a look-up table.

17. The method of claim 1, wherein the second stage counter value is characterized as having a second plurality of bits, the method further comprising:
 determining whether to eject the second plurality of bits of the second stage counter value from the second stage update unit to a third stage update unit, coupled to the second stage update unit, based on a random function of a probability of expiration of the second stage update unit; and
 responsive to the determination to eject the second stage counter value, ejecting the second plurality of bits from the second stage update unit to the third stage update unit.

18. The method of claim 17, wherein the ejecting the second plurality of bits comprises:
 clearing the second stage counter value; and
 accumulating the second plurality of bits to a third stage counter value of the third stage update unit.

19. The method of claim 18, wherein the ejecting the second plurality of bits further comprises:
 sending a counter ejection message.

20. The method of claim 17, wherein the ejecting. the second plurality of bits comprises:
 clearing the second stage counter value;
 enqueuing the second plurality of bits; and
 accumulating the plurality of bits to the second stage counter value.

21. The method of claim 1, further comprising:
 expiring the first stage update unit when the first stage update unit exceeds a predefined range.

22. A counter system, comprising:
 a first stage update unit configured to accept a count event and to eject a first stage counter value having a plurality of subvalues that are characterized as having corresponding bits from among a plurality of bits, the first stage update unit comprising:
  a counting module configured to modify the first stage counter value based on the count event; and
  an ejection module configured to eject the plurality of bits of the first stage counter value associated with the count event based on a random function of an expiration of the first stage update unit.

23. The counter system of claim 22, wherein the ejection module is further configured to clear the first stage counter value and to send a counter ejection message.

24. The counter system of claim 22, further comprising:
 a second stage update unit, coupled to the first stage update unit, characterized by a second stage counter value,
 wherein the ejection module is further configured to clear the first stage counter value and to accumulate the first stage counter value to the second stage counter value.

25. The counter system of claim 22, wherein the ejection module is further configured to clear the first stage counter value, and wherein the counter system further comprises:
 a queue, coupled to the first stage update unit, configured to enqueue the first stage counter value.

26. The counter system of claim 22, further comprising:
 a second stage update unit, coupled to the first stage update unit, configured to accept the plurality of bits of the first stage counter value from the first stage update unit, the second stage update unit comprising:
 a second counting module configured to accumulate the plurality of bits of the first stage counter value to a second stage counter value.

27. The counter system of claim. 22, wherein the first stage update unit comprises:
 a first plurality of subcounters, wherein a first subcounter and a second subcounter from among the plurality of subcounters is characterized by a first subvalue from among the plurality of subvalues and a second subvalue from among the plurality of subvalues, respectively.

28. The counter system of claim 22, wherein the count event specifies the first stage counter value.

29. The counter system of claim 22, further comprising
 a storage device configured to store a plurality of first stage counter values;
 wherein the first stage update unit further comprises:
  a counter value interface module configured to read the first stage counter value from among the plurality of first stage counter values from the storage device.

30. The counter system of claim 22, further comprising:
 a counter query manager configured to accept a counter query, to force an ejection of the plurality of bits of the first stage counter value from the first stage update unit, and to accept a second counter value from a second stage update unit, the second stage update unit being configured to receive the plurality of bits of the first stage counter value from the first stage update unit.

31. The counter system of claim 30, further comprising:
 a query buffer configured to buffer counter queries from the counter query manager and the first stage update unit.

32. The counter system of claim 31, wherein the query buffer comprises a first in first out (FIFO) queue.

33. The counter system of claim 22, further comprising:
 an ejection buffer configured to buffer the plurality of bits of the first stage counter value between the first stage update unit and a second stage update unit.

34. The counter system of claim 22, wherein the ejection buffer comprises:
 a first in first out (FIFO) queue.

35. The counter system of claim 22, wherein the ejection module comprises:
 a probability module configured to determine a probability of ejection based on the expiration;
 a number generator configured to generate a number; and
 a comparison module configured to compare the number and the probability of ejection.

36. The counter system of claim 35, wherein the number is a pseudo-random number.

37. The counter system of claim 35, wherein the number is a random number.

38. The counter system of claim 35, wherein the probability module comprises:
 a lookup table.

39. The counter system of claim 22, wherein the first stage update unit is configured to expire upon exceeding a predefined range.

40. A computer program product, comprising:
a non-transitory computer usable medium having computer program logic recorded thereon for enabling a processor to manage a plurality of counters, a counter from among the plurality of counters including a first stage update unit coupled to a second stage update unit, the first stage update unit and the second stage update unit being characterized by a first stage counter value having a plurality of bits and a second stage counter value, respectively, the first stage update unit and the second stage update unit including a first plurality of subcounters and a second plurality of subcounters, respectively, a first subcounter and a second subcounter from among the first plurality of subcounters being characterized by a first subvalue having a first set of bits from among the plurality of bits and a second subvalue having a second set of bits from among the plurality of bits, respectively, the computer program logic including:
instructions for enabling the processor to receive a count event associated with the counter;
instructions for enabling the processor to update the first stage counter value based on the count event;
instructions for enabling the processor to determine, based on a random function of an expiration of the first stage update unit, whether to eject the first stage counter value from the first stage update unit to the second stage update unit;
instructions for enabling the processor to eject the plurality of bits from the first stage update unit to a second stage update unit; and
instructions for enabling the processor to update the first subvalue and the second subvalue of the first stage update unit based on the count event.

41. The computer program product of claim 40, wherein the instructions for enabling the processor to eject comprise:
instructions for enabling the processor to clear the first stage counter value; and
instructions for enabling the processor to accumulate the plurality of bits to the second stage counter value.

42. The computer program product of claim 41, wherein the instructions for enabling the processor to eject further comprise:
instructions for enabling the processor to send a counter ejection message.

43. The computer program product of claim 40, wherein the instructions for enabling the processor to eject comprise:
instructions for enabling the processor to clear the first stage counter value;
instructions for enabling the processor to enqueue the plurality of bits; and
instructions for enabling the processor to accumulate the plurality of bits to the second stage counter value.

44. The computer program product of claim 43, wherein the enqueuing is to a first in first out (FIFO) queue in communication with the second stage update unit.

45. The computer program product of claim 40, wherein the instructions for enabling the processor to eject comprise:
instructions for enabling the processor to accumulate the first set of bits and the second set of bits from the first stage update unit to a first subvalue of a first subcounter from among the second plurality of subcounters and a second subvalue of a second subcounter from among the second plurality of subcounters, respectively.

46. The computer program product of claim 40, wherein the expiration is the expiration of a subcounter from among the first plurality of subcounters.

47. The computer program product of claim 40, wherein the count event specifies the first stage update unit.

48. The computer program product of claim 40, wherein the instructions for enabling the processor to update further comprise:
instructions for reading the first stage counter value from a storage device.

49. The computer program product of claim 48, further comprising:
instructions for enabling the processor to write the plurality of bits to the storage device if the plurality of bits were not ejected.

50. The computer program product of claim 40, further comprising:
instructions for enabling the processor to answer a query, Wherein the instructions for enabling the processor to answer comprise:
instructions for enabling the processor to receive the query;
instructions for enabling the processor to accumulate the plurality of bits to the second stage update unit; and
instructions for enabling the processor to clear the plurality of bits.

51. The computer program product of claim 40, wherein the expiration is based on a range of the first stage update unit and the first stage counter value.

52. The computer program product of claim 40, wherein the instructions for enabling the processor to determine comprise:
instructions for enabling the processor to determine a probability of ejection based on the expiration;
instructions for enabling the processor to generate a number; and
instructions for enabling the processor to compare the number to the probability of ejection.

53. The computer program product of claim 52, wherein the number is a pseudo-random number.

54. The computer program product of claim 52, wherein the number is a random number.

55. The computer program product of claim 52, wherein the instructions for enabling the processor to determine the probability of ejection are performed using a lookup table.

56. The computer program product of claim 40, wherein the second stage counter value is characterized as having a second plurality of bits, the computer program product further comprising:
instructions for enabling the processor to determine whether to eject the second plurality of bits of the second stage counter value from the second stage update unit to a third stage update unit, the third stage update unit being coupled to the second stage update unit, based on a random function of a probability of expiration of the second stage update unit; and
instructions for enabling the processor to eject the second plurality of bits from the second stage update unit to the third stage update unit responsive to the determination to eject the second stage counter value.

57. The computer program product of claim 56, wherein the instructions for enabling the processor to eject the second stage counter value comprise:
instructions for enabling the processor to clear the second stage counter value; and
instructions for enabling the processor to accumulate the second plurality of bits to a third stage counter value of the third stage update unit.

58. The computer program product of claim 57, wherein the instructions for enabling the processor to eject the second stage counter value further comprise:
   instructions for enabling the processor to send a counter ejection message.

59. The computer program product of claim 56, wherein the instructions for enabling the processor to eject the second stage counter value comprise:
   instructions for enabling the processor to clear the second stage counter value;
   instructions for enabling the processor to enqueue the ejected second stage counter value; and
   instructions for enabling the processor to accumulate the plurality of bits to the second stage counter value.

60. The computer program product of claim 40, further comprising:
   instructions to expire the first stage update unit when the first stage update unit exceeds a predefined range.

\* \* \* \* \*

UNITED STATES PATENT AND TRADEMARK OFFICE
CERTIFICATE OF CORRECTION

PATENT NO. : 8,417,810 B2
APPLICATION NO. : 11/971787
DATED : April 9, 2013
INVENTOR(S) : Nicholas Horgan It is certified that error appears in the above-identified patent and that said Letters Patent is hereby corrected as shown below:

In the Claims:

Column 17, Line 38, please replace "ejecting." with --ejecting--.

Column 18, Line 15, please replace "claim." with --claim--.

Column 18, Line 24, please replace "comprising" with --comprising:--.

Column 20, Line 17, please replace "Wherein" with --wherein--.

Signed and Sealed this
Thirtieth Day of July, 2013

Teresa Stanek Rea
*Acting Director of the United States Patent and Trademark Office*